HIGH PERFORMANCE, WIDE BAND, VHF-UHF AMPLIFIER

Filed Nov. 15, 1968

INVENTORS,
HENRY CHIN
JOHN J. CADIGAN, III.
BY: Milton W. Lee AGENT
Harry M. Saragovitz,
Edward J. Kelly &
Herbert Berl
ATTORNEYS United States Patent Office 3,486,126
Patented Dec. 23, 1969

3,486,126
HIGH PERFORMANCE, WIDE BAND, VHF-UHF AMPLIFIER

Henry Chin, Burlington, and John J. Cadigan III, Hingham, Mass., assignors, by mesne assignments, to the United States of America as represented by the Secretary of the Army Filed Nov. 15, 1968, Ser. No. 776,093
Int. Cl. H03f *3/04, 1/32*
U.S. Cl. 330—21 3 Claims

ABSTRACT OF THE DISCLOSURE

A wide band amplifier, operative over at least three octave bandwidths, exhibiting low distortion in the VHF-UHF band. Circuitry for the amplifier is fabricated as a current source driven, double terminated, third order, low pass filter having transistors and other circuit elements utilized in such a manner that normal undesirable collector and terminal capacitances function as integral parts of the circuit.

Background of the invention

This invention relates to broad band transistor amplifiers and more particularly to transistor amplifiers having a flat frequency response over a very broad frequency band width.

Prior art amplifiers operative over a wide frequency band have been severely limited in performance by inherent stray reactances within the circuitry. However, the primary problem heretofore existing in the prior art devices has resided in the seemingly impossible task of obtaining both linear and wideband operation from a single amplifier circuit. The prior art discloses circuits for both linear amplifiers and broadband amplifiers, but linear operation over a wide band of frequencies has been essentially nonexistent without the use of complex and expensive circuitry and even then a performance tradeoff of either linearity or frequency range is essential.

Summary of the invention

The present invention very effectively overcomes the disadvantages of the prior art while enjoying all the advantages thereof by providing a very simple transistorized broad band amplifier circuit which is compact and relatively inexpensive to manufacture.

The general purpose of this invention is to provide a linear amplifier having a bandwidth in excess of three octaves with low distortion in the VHF-UHF bands. To attain this, a pair of transistors are connected in tandem with each transistor having an adjustable reactive element for controlling the selectivity or sharpness of tuning. The two transistors are operated in phase, and are biased such that, over the entire dynamic range, the gain bandwidth product remains constant.

Brief description of the drawings

The exact nature of this invention will be readily apparent from consideration of the following specification relating to the annexed drawings wherein.

Description of the invention

Figure 1:
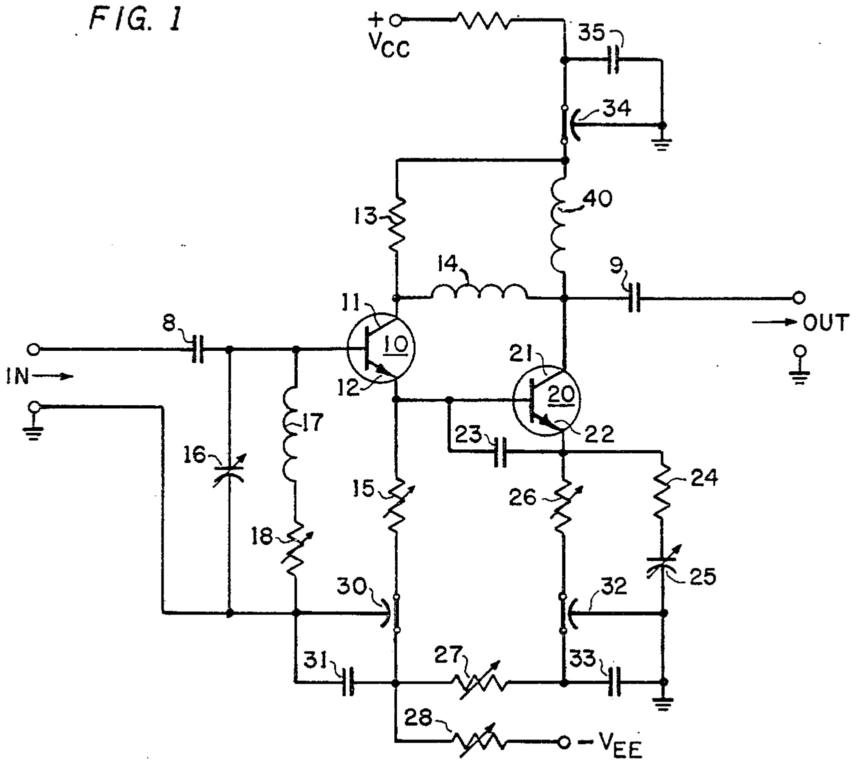
FIGURE 1 shows one stage of a transistorized broad band amplifier utilizing the pirnciples embraced in the present invention.

In order to more clearly present this invention, a single, low-power amplifier stage utilizing a pair of low noise transistors will be described in conjunction with FIGURE 1. The circuit shown in FIGURE 1 is merely one stage of a unique multi-stage amplifier design using several easily implemented techniques to achieve extremely wide bandwidth in excess of three octaves and low distortion in the VHF-UHF bands.

Linear amplifiers having pass bands from 50 mHz. to 550 mHz., flat to within ±0.5 db, and having 10 to 12 db gain in a 50 ohm system are readily produced with common transistors. A circuit layout which reduces stray reactances, which are critical at these frequencies and bandwidths, to acceptable levels without resorting to strip-line techniques is also implemented herein.

A four-stage amplifier was constructed, using this technique, which provided a gain of 39±1.25 db from 100 to 400 mHz. Maximum total harmonic distortion for 1 VRMS output into 50 ohms was 1.2%, for 1.9 VRMS output into 50 ohms maximum gain compression was 1.4 db with a mean value of 0.6 db across the band. Unit to unit reproducibility has proven to be excellent.

Referring now specifically to FIGURE 1, the amplifier is basically a current source driven, double terminated, third order low pass filter. The resistive terminations are provided by resistor 13, the load resistance and the real part of the transistor's output impedance. The inductance is provided by inductor 14, and the capacitive elements by the imaginary part of the transistor's output impedance together with the capacitance of the standoff terminal. In this way the normally undesired collector and terminal capacitances are utilized as integral parts of the circuit. Impedance transformation between the collectors, if necessary, may be accomplished through the utilization of Bartlett's bisection theorem.

Since the two port admittance, or Y, parameters of transistors 10 and 20 vary as a function of frequency, the filter just decided will not function as an ideal, constant element device. It is thus necessary to provide some additional frequency compensation.

A slight amount of positive feedback, provided by capacitor 23, is used to obtain proper phase drive through transistor 20 for the filter. Note that since the base to emitter gain is less than unity, stability is no problem.

The quality factor is limited by emitter bypass, provided for transistor 20 by resistor 24 and variable capacitor 25.

Figure 2:
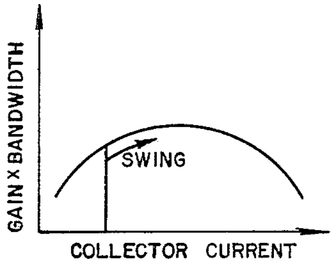
FIGURES 2*a* and 2*b* show typical gain bandwidth product variations with collector current of each transistor in the single stage of FIGURE 1.
Figure 2:
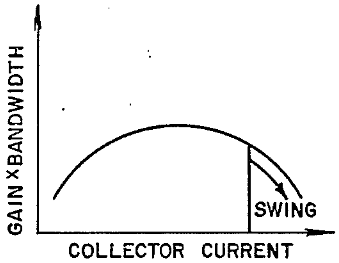

The collector currents of transistors 10 and 20 should be set in accordance with the gain bandwidth product vs. collector current as shown in FIGURES 2*a* and 2*b*, respectively.

Since the two transistors are approximately in phase, both will swing as shown. Thus over the entire dynamic swing, the gain bandwith product will remain constant. The desired levels and balance of collector current is obtained by adjusting resistors 15, 26, 27 and 28. Note that both transistors drive the load. Thus for a given load current dynamic swing collector current excursions are minimized, thereby reducing dynamic Y parameter and gain bandwith product variations. Input matching is provided by variable capacitor 16, inductor 17 and resistor 18, with variable resistor 18 used to control the Q, of the tuned circuit. Only one tuning element per transistor is used, i.e., capacitor 16 and 25. Thus by using swept frequency techniques, tuning is extremely quick and simple.

Consider the transistor configuration. Transistor 20 is driven from a low impdeance source, thus matching its low impedance input. Also emitter degeneration is used in transistor 10 to increase the input impedance to match 50 ohms. The degree of degeneration, of course, is proportional to the input impedance of transistor 20 since variable resistor 15 is typically several hundred ohms.

Capacitors 8 and 9 are used as conventional blocking capacitors, with capacitors 30, 31, 32, 33, 34 and 35 used as conventional decoupling capacitors. Inductor 40 is chosen sufficiently large as not to alter the third order filter concept.

It should be understood that the above described amplifier is not meant to limit the invention in any manner, as it may take many mounting forms, such as a printed circuit, a strip line, a thin film circuit or an integrated circuit, which would suggest to those skilled in the art various alternative supporting and coupling arrangement.

We claim:

1. A broad band transistor amplifier comprising:

first and second transistors, each transistor having a base, an emitter and a collector;

the emitter of said first transistor is coupled to the base of said second transistor, thereby presenting a low impedance input to the base circuit of the second transistor such that the two transistors operate in phase;

a first tuning capacitor connected across a pair of input terminals and to the base of the first transistor;

a second tuning capacitor coupled to the emitter of the second transistor whereby the desired bandwidth of operation may be readily obtained by adjustment of the tuning capacitors;

an inductive reactance is coupled between the collectors of the two transistors and functions in conjunction with the inherent collector and terminal capacitance to effect a low pass filtering action;

a first variable impedance element connected to the emitter of the first transistor and a second variable impedance element coupled in parallel relationship with the tuning capacitor in the emitter circuit of said second transistor, whereby the collector currents may be adjusted such that the gain bandwidth product will remain constant over the entire dynamic range of operation; and an output circuit coupled from the collector of said second transistor.

2. The broadband amplifier as set forth in claim 1, further including a series arrangement of an inductor and a variable resistor connected in parallel relationship with said first tuning capacitor, whereby an input matching circuit is realized with said variable resistor further providing a means for controlling the quality factor of the tuned circuit.

3. The apparatus as set forth in claim 2, further including a capacitor coupled between the base and emitter of the second transistor, whereby positive feedback is realized for obtaining proper phase drive through the second transistor.

References Cited

UNITED STATES PATENTS 3,434,020 3/1969 Bartnik et al. -------- 330—21

ROY LAKE, Primary Examiner

LAWRENCE J. DAHL, Assistant Examiner

U.S. Cl. X.R.

330—32